United States Patent
Shi et al.

(10) Patent No.: US 9,261,726 B2
(45) Date of Patent: Feb. 16, 2016

(54) PHOTOELECTRIC SENSOR AND PHOTOELECTRIC TOUCH PANEL

(71) Applicant: BOE Technology Group Co., Ltd., Beijing (CN)

(72) Inventors: Shiming Shi, Beijing (CN); Yunfei Li, Beijing (CN); Lu Wang, Beijing (CN)

(73) Assignee: BOA Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/143,484

(22) Filed: Dec. 30, 2013

(65) Prior Publication Data

US 2014/0211106 A1 Jul. 31, 2014

(30) Foreign Application Priority Data

Jan. 25, 2013 (CN) .......................... 2013 1 0030237

(51) Int. Cl.

| G06F 3/041 | (2006.01) |
| G02F 1/1333 | (2006.01) |
| H01L 27/12 | (2006.01) |
| G09G 3/00 | (2006.01) |
| H01L 31/00 | (2006.01) |
| G06F 3/042 | (2006.01) |
| G02F 1/133 | (2006.01) |

(52) U.S. Cl.
CPC ............ *G02F 1/13338* (2013.01); *G06F 3/042* (2013.01); *G06F 3/0412* (2013.01); *G09G 3/00* (2013.01); *H01L 27/1255* (2013.01);
(Continued)

(58) Field of Classification Search
None
See application file for complete search history.

(56) References Cited

U.S. PATENT DOCUMENTS

| 8,593,426 B2 * | 11/2013 | Westerman et al. .......... 345/173 |
| 2002/0000508 A1 | 1/2002 | Muramatsu et al. |
| 2011/0122111 A1 * | 5/2011 | Brown et al. ................. 345/207 |

FOREIGN PATENT DOCUMENTS

| CN | 1971920 A | 5/2007 |
| CN | 101414068 A | 4/2009 |

(Continued)

OTHER PUBLICATIONS den Boer, Willem et al., "56.3: Active Matrix LCD with Integrated Optical Touch Screen", Planar Systems, Inc., Beaverton, Oregon, SID Digest, ISSN/0003-0966X/03/3402-1494-$1.00+.00(c)2003 SID, 4 pages.

(Continued)

*Primary Examiner* — Joseph Haley
(74) *Attorney, Agent, or Firm* — Westman, Champlin & Koehler, P.A.

(57) ABSTRACT

A photoelectric sensor, comprising: a first thin film transistor (T1) for converting a photo signal into an electrical signal; a second thin film transistor (T2) for performing an integration operation on the electrical signal; a third thin film transistor (T3) for reading the electrical signal; and a first capacitor (C1) for storing an energy of the electrical signal, wherein a drain electrode of the first thin film transistor (T1) is connected to one end of the first capacitor (C1) and a source electrode of the third thin film transistor (T3); a source electrode of the first thin film transistor (T1) is connected to a drain electrode of the second thin film transistor (T2); a gate electrode of the first thin film transistor (T1) is supplied with a bias signal; wherein a gate electrode of the second thin film transistor (T2) is supplied with an integration signal; a source electrode of the second thin film transistor (T2) is connected to a high level end of a power source; the other end of the first capacitor (C1) is connected to a low level end of the power source; and wherein a gate electrode of the third thin film transistor (T3) is supplied with a scan signal; a drain electrode of the third thin film transistor (T3) is configured to output the read electrical signal.

7 Claims, 5 Drawing Sheets

(52) U.S. Cl.
CPC ...... *H01L31/00* (2013.01); *G02F 2001/13312* (2013.01); *G09G 2360/144* (2013.01)

(56) References Cited

FOREIGN PATENT DOCUMENTS

| CN | 101943974 A | 1/2011 |
|---|---|---|
| CN | 101989152 A | 3/2011 |

OTHER PUBLICATIONS

First Chinese Office Action for Chinese Patent Application No. 201310030237.X, dated Apr. 22, 2015, 13 pages.

Rejection Decision for Chinese Application No. 201310030237.X, dated Sep. 22, 2015, 14 pages.

\* cited by examiner

PHOTOELECTRIC SENSOR AND PHOTOELECTRIC TOUCH PANEL

CROSS-REFERENCE TO RELATED APPLICATION

This application claims the benefit of Chinese Patent Application No. 201310030237.X filed on Jan. 25, 2013 in the State Intellectual Property Office of China, the whole disclosure of which is incorporated herein by reference.

BACKGROUND OF THE INVENTION

1. Field of the Invention

The present invention relates to a technical field of a photo touch panel, more particularly, relates to a photoelectric sensor and a photoelectric touch panel.

2. Description of the Related Art

When exposed to a visible light, the α-Si TFT (Thin Film Transistor) generates a relative large photo current. In a TFT-LCD (Thin Film Transistor Liquid Crystal Display), in order to achieve a small drain current, it is necessary to block the channel of the α-Si TFT from light as can as possible. For example, a metal material is used at one side of the α-Si TFT adjacent to a backlight to block the light from the backlight, a black matrix is used at the other side of the α-Si TFT adjacent to a color film substrate to block the light from outside environment. In fact, the drain current of the α-Si TFT is increased with the increase of the intensity of the light irradiating on the α-Si TFT. Herein, the drain current of the α-Si TFT is referred as the photo current.

With the characteristic of the photo current of the α-Si TFT, a photoelectric conversion and a light input can be accomplished. As a result, a photo touch panel can be incorporated into the TFT-LCD, for achieving both the display function and the touch function on the TFT-LCD.

FIG. 1 shows a conventional photoelectric sensor of a photo touch panel in prior arts. As shown in FIG. 1, the photoelectric sensor comprises a photoelectric TFT T1, a readout TFT T3 and a capacitor C1. The photoelectric TFT T1 is constructed to convert a photo signal into an electrical signal. The readout TFT T3 is constructed to read out the electrical signal and output the read electrical signal to an external circuit to further process the electrical signal. The gate electrode and the source electrode of the photoelectric TFT T1 are connected to each other, and the photoelectric TFT T1 is always in an integration state when reading each frame of data. Particularly, when there is an interference of environment light during operation of the photoelectric TFT T1, it causes a large interference noise. When the intensity of the light is strong, for example, under the direct irradiation of the sunlight, the photo current generated in the photoelectric TFT T1 is very large. Furthermore, the integration time of the TFT T1 is relative long, thereby the TFT T1 may occur the charging saturation and cannot normally respond to a photo signal input from a light pen for inputting the photo signal into the photoelectric sensor.

SUMMARY OF THE INVENTION

The present invention has been made to overcome or alleviate at least one aspect of the above mentioned disadvantages.

Accordingly, it is an object of the present invention to provide a photoelectric sensor and a photoelectric touch panel that can prevent a charging saturation occurred in a photoelectric TFT.

Accordingly, it is another object of the present invention to provide a photoelectric sensor and a photoelectric touch panel that are very sensitive to a photo signal input from a light pen.

According to an aspect of the present invention, there is provided a photoelectric sensor, comprising: a first thin film transistor T1 for converting a photo signal into an electrical signal; a second thin film transistor T2 for performing an integration operation on the electrical signal; a third thin film transistor T3 for reading the electrical signal; and a first capacitor C1 for storing an energy of the electrical signal, wherein a drain electrode of the first thin film transistor T1 is connected to one end of the first capacitor C1 and a source electrode of the third thin film transistor T3, respectively; a source electrode of the first thin film transistor T1 is connected to a drain electrode of the second thin film transistor T2; a gate electrode of the first thin film transistor T1 is connected to a bias signal; wherein a gate electrode of the second thin film transistor T2 is connected to an integration signal; a source electrode of the second thin film transistor T2 is connected to a high level end of a power source; the other end of the first capacitor C1 is connected to a low level end of the power source; and wherein a gate electrode of the third thin film transistor T3 is connected to a scan signal; a drain electrode of the third thin film transistor T3 is configured to output the read electrical signal.

In an exemplary embodiment, the above photoelectric sensor further comprising: a fourth thin film transistor T4 for loading a voltage to a pixel; and a second capacitor C2 for maintaining the voltage stable, wherein a gate electrode of the fourth thin film transistor T4 is connected to the gate electrode of the third thin film transistor T3; and wherein one end of the second capacitor C2 is connected to the one end of the first capacitor C1 and the low level end of the power source, and the other end of the second capacitor C2 is connected to a drain electrode of the fourth thin film transistor T4.

According to another aspect of the present invention, there is provided a photoelectric touch panel, comprising: the above mentioned photoelectric sensors; a substrate for carrying the photoelectric sensor thereon; an integration control circuit for providing the integration signal; a gate scan drive circuit for providing the scan signal; a charge readout circuit for reading electrical charges; a common voltage circuit for providing the low level of the power source; a direct current voltage circuit for providing the high level of the power source; and a bias voltage circuit for proving the bias signal, wherein the plurality of photoelectric sensors are arranged on the substrate in rows and columns; wherein the gate electrode of the first thin film transistor T1 of the photoelectric sensor is connected to the bias voltage circuit; wherein the first capacitor C1 of the photoelectric sensor is connected to the common voltage circuit; wherein the source electrode of the second thin film transistor T2 of the photoelectric sensor is connected to the direct current voltage circuit, and the gate electrode of the second thin film transistor T2 of the photoelectric sensor is connected to the integration control circuit; and wherein the gate electrode of the third thin film transistor T3 of the photoelectric sensor is connected to the gate scan drive circuit, and the drain electrode of the third thin film transistor T3 of the photoelectric sensor is connected to the charge readout circuit.

In an exemplary embodiment, the photoelectric touch panel further comprising: an analog to digital conversion circuit connected to an output end of the charge readout circuit.

In the above photoelectric touch panel, the analog to digital conversion circuit comprises a plurality of integral amplifiers; the positive electrode of the integral amplifier is connected to a reference voltage, the negative electrode of the integral amplifier is used as an input end of the charge readout circuit, and the output end of the integral amplifier is used as the output end of the charge readout circuit and connected to the negative electrode of the integral amplifier through a third capacitor.

In the above photoelectric touch panel, when the photoelectric sensor further comprises the fourth thin film transistor T4 for loading a voltage to a pixel and the second capacitor C2 for maintaining the voltage stable, the photoelectric touch panel further comprises a source electrode drive circuit connected to the source electrode of the fourth thin film transistor T4.

In the photoelectric sensor according to various embodiments of the present invention, the drain electrode of the first thin film transistor T1 is connected to one end of the first capacitor C1 and the source electrode of the third thin film transistor T3, the source electrode of the first thin film transistor T1 is connected to the drain electrode of the second thin film transistor T2. Thereby, the present invention overcomes the problem of the charging saturation occurred in the photoelectric TFT of the conventional photoelectric sensor shown in FIG. 1 due to the connection of the source electrode and the drain electrode thereof. As a result, the photoelectric sensor of the present invention has a strong anti-interference ability and is very sensitive to the photo signal input from the light pen. In addition, the photoelectric touch panel incorporated with the photoelectric sensors can accurately identify the photo signal input from the light pen.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED EMBODIMENTS OF THE INVENTION

Figure 1:
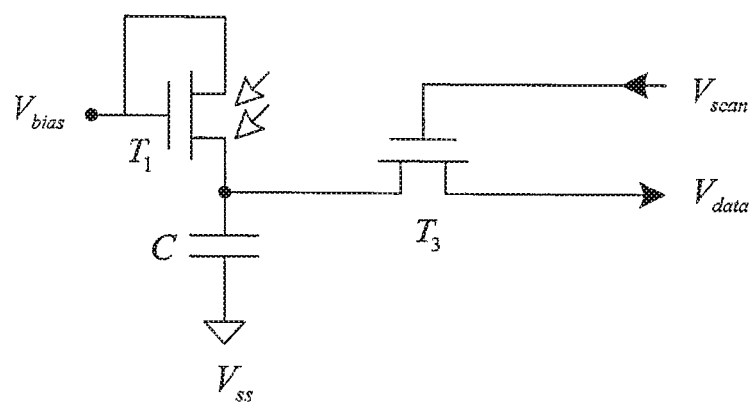
FIG. 1 is an illustrative view of a conventional photoelectric sensor of a photo touch panel in prior arts.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In order to overcome the problem of the conventional photoelectric sensor in prior arts that the photoelectric sensor is not sensitive to the photo signal input and has a poor anti-interference ability to the environment light due to the charging saturation occurred in the photoelectric TFT of the conventional photoelectric sensor.

According to a general concept of the present invention, there is provided a photoelectric sensor and a photoelectric touch panel.

Hereafter, it will describe the photoelectric sensor in detail according to an exemplary embodiment of the present invention.

(1) An integration control thin film transistor (a second thin film transistor T2) is provided in a photoelectric conversion circuit based on the property of the photo current of the α-Si TFT, so that the integration time of the photoelectric TFT is controllable and can be adjusted according to the intensity of the environment light. As a result, it not only can achieve the photoelectric conversion function, but also avoid the charging saturation due to an overlong integration time. In addition, a photoelectric touch panel and a TFT-LCD incorporated with the photoelectric touch panel are also provided based on the photoelectric conversion circuit.

Figure 2:
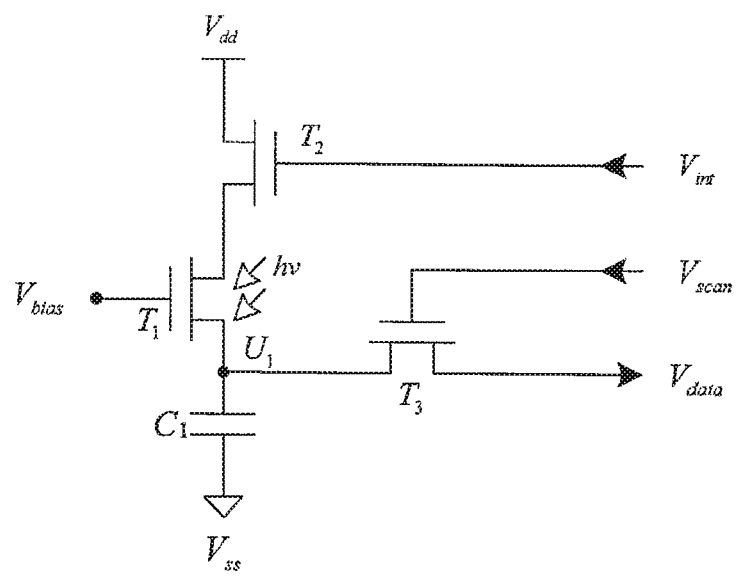
FIG. 2 is an illustrative view of a photoelectric conversion circuit according to an exemplary embodiment of the present invention.

FIG. 2 is an illustrative view of a photoelectric conversion circuit according to an exemplary embodiment of the present invention.

As shown in FIG. 2, the photoelectric conversion circuit comprising: a first thin film transistor T1 for converting a photo signal into an electrical signal; a second thin film transistor T2 for performing an integration operation on the electrical signal; a third thin film transistor T3 for reading the electrical signal; and a first capacitor C1 for storing an energy of the electrical signal. A drain electrode of the first thin film transistor T1 is connected to one end of the first capacitor C1 and a source electrode of the third thin film transistor T3; a source electrode of the first thin film transistor T1 is connected to a drain electrode of the second thin film transistor T2; a gate electrode of the first thin film transistor T1 is supplied with a bias signal. A gate electrode of the second thin film transistor T2 is supplied with an integration signal; a source electrode of the second thin film transistor T2 is connected to a high level end of a power source; the other end of the first capacitor C1 is connected to a low level end of the power source. A gate electrode of the third thin film transistor T3 is supplied with a scan signal; a drain electrode of the third thin film transistor T3 is configured to output the read electrical signal.

The first thin film transistor T1 functions as a photoelectric TFT, the second thin film transistor T2 functions as an integration TFT, the third thin film transistor T3 functions as a reading TFT, the first capacitor C1 functions as a storage capacitor for the photoelectric conversion. A bias voltage Vbias is applied on the gate electrode of the first thin film transistor T1, so that the first thin film transistor T1 is in a cutoff region and has a drain current at a dark current value, generally, in an order of pA.

The light signal is controlled within the integration time by means of the photoelectric TFT. The capacitor is charged with the photoelectric current. When the photoelectric TFT is turned off after completing the integration operation, a voltage change $\Delta U_1$ of a node voltage $U_1$ can be expressed as follows.

$$\Delta U_1 = \frac{1}{C} \int_{t_1}^{t_1+t_{int}} I_{PHOTO}(t)\, dt$$

Wherein, $I_{PHOTO}(t)$ refers to the photoelectric current of the photoelectric TFT; $t_{int}$ refers to a turn-on time; $t_1$ refers to any timing.

In this way, the node voltage $U_1$ may be selected, for example, within arrange of –5~0V, and values of bias voltage $V_{bias}$, direct current $V_{dd}$, common voltage $V_{ss}$ and values of integration control voltage $V_{int}$ at turn-on timing and turn-off timing can be selected. Wherein, $V_{dd}$=–5V–$VT_1$, $V_{ss}$=0V. $V_{int}$ is selected to produce a certain voltage difference between the source and drain electrodes of the photoelectric TFT to ensure the photoelectric current more stable. The turn-off value of the $V_{int}$ is set as an operation voltage at which the integration TFT is in a cutoff state, and the turn-on value of the $V_{int}$ is set as an operation voltage at which the integration TFT is in saturation state and larger than threshold voltage $VT_{int}$ of the integration TFT. Also, the turn-off and turn-on values of the scan voltage $V_{scan}$ may be the same as the turn-off and turn-on values of $V_{int}$.

In operation, when the photoelectric TFT T1 is irradiated with a light emitted from a special pen (referred as a light pen herein) having a light source, and when the $V_{int}$ is loaded on a respective row, the respective integration TFT T2 is turned on, and a photoelectric current is generated under the light irradiation. Since the node voltage $U_1$ is preset at 0V, the capacitor may be discharged within the integration time. After completing the discharging, the integration TFT T2 is turned off. When the scan voltage Vscan is loaded on the respective row, the respective readout TFT T3 is turned on, and the charge signal of the storage capacitor C1 can be converted to an electrical signal by means of a charge readout chip, and the electrical signal can be converted from an analog signal to a digital signal by means of an analog-digital converter, and the digital signal can be further processed for the position identification.

Figure 3:
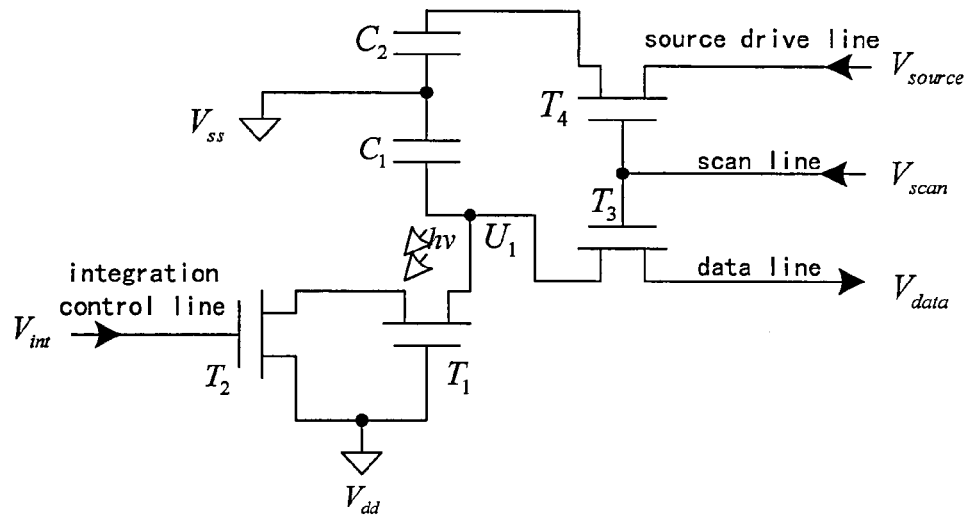
FIG. 3 is an illustrative principle view of pixels in a photoelectric touch panel incorporated into a liquid crystal display according to an exemplary embodiment of the present invention.

(2) When the photoelectric touch sensor is incorporated into the TFT-LCD, the principle of achieving pixel arrangement of the TFT-LCD may be designed as shown in FIG. 3.

As shown in FIG. 3, the photoelectric sensor may further comprise a fourth thin film transistor T4 for loading a voltage to a pixel and a second capacitor C2 for maintaining the voltage stable. A gate electrode of the fourth thin film transistor T4 is connected to the gate electrode of the third thin film transistor T3. One end of the second capacitor C2 is connected to the one end of the first capacitor C1 and the low level end of the power source Vss, and the other end of the second capacitor C2 is connected to a drain electrode of the fourth thin film transistor T4.

In an exemplary embodiment, the $V_{bias}$ may be connected to the $V_{dd}$, thereby the $V_{bias}$ and the $V_{dd}$ may be powered by a common power supply, reducing the number of signal lines. The gate scan line of the photoelectric touch sensor and the gate scan line of the LCD share the $V_{scan}$. The source electrode drive voltage of the LCD may be defined as Vsource. The display voltage of the LCD may be applied with a source electrode drive chip according to signal sequence. The second capacitor C2 functions as a storage capacitor for maintaining the voltage of the LCD stable. The common electrode is connected to the $V_{ss}$. The fourth thin film transistor T4 functions as a liquid crystal pixel TFT for loading the voltage of the source electrode drive line on the pixel.

Hereafter, it will describe a photoelectric touch panel based on the above photoelectric touch sensor according to various embodiments of the present invention.

Figure 4:
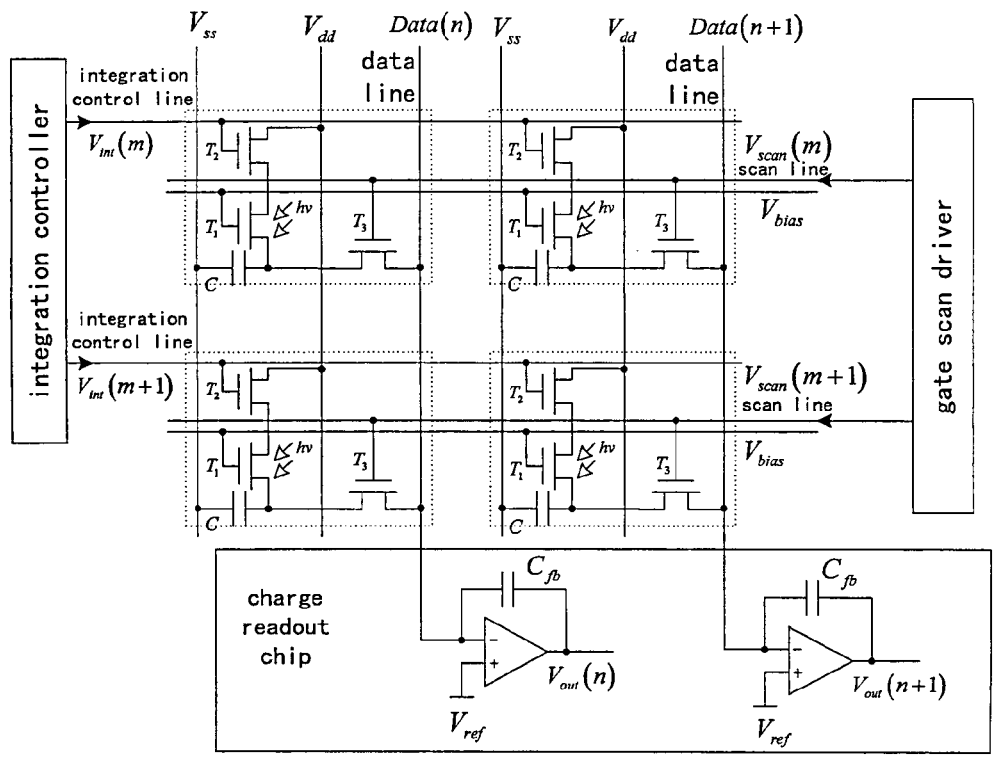
FIG. 4 is an illustrative principle view of a photoelectric touch panel according to an exemplary embodiment of the present invention.

(1) FIG. 4 is an illustrative principle view of a photoelectric touch panel according to an exemplary embodiment of the present invention. As shown in FIG. 4, the photoelectric touch panel comprising: a plurality of photoelectric sensors according to the above embodiments; a substrate for carrying the photoelectric sensor thereon; an integration control circuit for providing the integration signal; a gate scan drive circuit for providing the scan signal; a charge readout circuit for reading electrical charges; a common voltage circuit for providing the low level of the power source; a direct current voltage circuit for providing the high level of the power source; and a bias voltage circuit for proving the bias signal.

The plurality of photoelectric sensors are arranged on the substrate in rows and columns; the gate electrode of the first thin film transistor T1 of the photoelectric sensor is connected to the bias voltage circuit; the first capacitor C1 of the photoelectric sensor is connected to the common voltage circuit; the source electrode of the second thin film transistor T2 of the photoelectric sensor is connected to the direct current voltage circuit, and the gate electrode of the second thin film transistor T2 of the photoelectric sensor is connected to the integration control circuit; the gate electrode of the third thin film transistor T3 of the photoelectric sensor is connected to the gate scan drive circuit, and the drain electrode of the third thin film transistor T3 of the photoelectric sensor is connected to the charge readout circuit. Furthermore, an output of the charge readout circuit is connected to the analog-digital converter, and an anode of an integration amplifier of the charge readout circuit is connected to a reference voltage.

Figure 5:
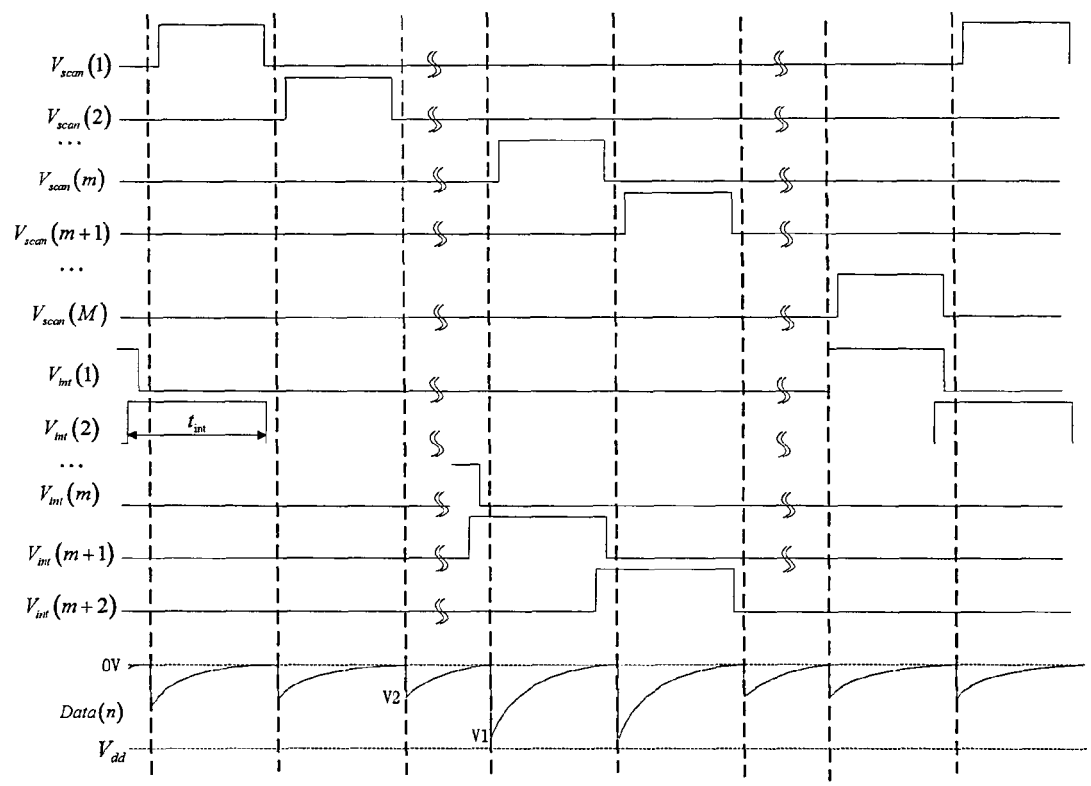
FIG. 5 is a sequence diagram of a photoelectric touch panel according to an exemplary embodiment of the present invention.

The Voltage $V_{int}$ of the integration control circuit is controlled by the integration controller, and the scan voltage $V_{scan}$ is controlled by the gate scan drive circuit. $V_{ss}$, $V_{dd}$, $V_{bias}$ provide the power supply or the bias supply. The data line Data is connected to a cathode of the integration amplifier of the charge readout circuit, and the reference voltage $V_{ref}$ is applied on the anode of an integration amplifier and is set as 0V. The output $V_{out}$ of the charge readout circuit is connected to the analog-digital converter, and the analog-digital converter is used to sample and digitalize the output $V_{out}$ to convert it to the digital signal. FIG. 5 is a sequence diagram of a photoelectric touch panel according to an exemplary embodiment of the present invention. As shown in FIG. 5, the scan voltage $V_{scan}$ sequentially scans row by row. The high level indicates that the readout TFTs on the respective row are turned on, and the low level indicates that the readout TFTs on the respective row are turned off. For example, when the $m^{th}$ row is scanned, the scan voltage $V_{scan}(m)$ on the $m^{th}$ row becomes the high level, and the voltages on the other rows are all in the low level. That is, the $m^{th}$ row is currently read, and after the readout TFTs are turned on, the charges of the storage capacitors can transferred to the respective data line Data through the readout TFTs of each column and converted to the voltage signals by charge amplifiers, and the voltage signals may be further supplied to the subsequent analog-digital converters and signal processors.

After completing the scan of the $m^{th}$ row, the $V_{scan}(m)$ is set as the low level, and the readout TFT of the $m^{th}$ row is turned off, and the scan voltage $V_{scan}$ begins to scan the $(m+1)^{th}$ row.

An integration control line turns on the integration TFTs prior to the scan line, and the turn-off timing of the integration control line is prior to the turn-on timing of the current scan line, that is, the signal integration is completed before scanning the current line. As shown in FIG. 5, the turn-on timing $t_{int}$ of the voltage $V_{int}(m)$ of the integration control circuit can be adjusted according the intensity of the input light signal. When the environment light causes the node voltage $U_1$ equal to the $V_{dd}$ within the integration time, that is, when the intensity of the environment light is stronger than that of the photo signal input from the light pen, the integration time $t_{int}$ is properly reduced to correctly identify the photo signal input from the light pen without a requirement to increase the illumination intensity of the photo signal input from the light pen until beyond the intensity of the environment light. In this way, the photoelectric sensor of the present invention effectively overcomes the problem that the conventional photoelectric sensor cannot correctly identify the photo signal input from the light pen in prior arts when the intensity of the environment light is stronger than that of the photo signal input from the light pen. On the contrary, when the environment light is relative weak, the integration time may be increased with decreasing the illumination intensity of the light pen.

As shown in FIG. 5, under the sequential control of the scan line and the integration control line, the voltage of each pixel point can be read. In a region where there is no light illumination from the light pen and the photoelectric sensor receives only the environment light, the absolute value $|V_2|$ of voltage $V_2$ becomes very low. In a region illuminated by the light pen, the absolute value $|V_1|$ of voltage $V_1$ becomes very high. As a result, it can determine whether a desired light signal is occurred in respective nodes. For example, as shown in FIG. 5, it can determine that the light signal is occurred in the $m^{th}$ row and the $(m+1)^{th}$ row of the $n^{th}$ column. After the voltage signal is converted to the digital signal, it can extract the brighter region by an image processing, and can obtain the coordinate position of the photo signal input from the light pen.

Figure 6:
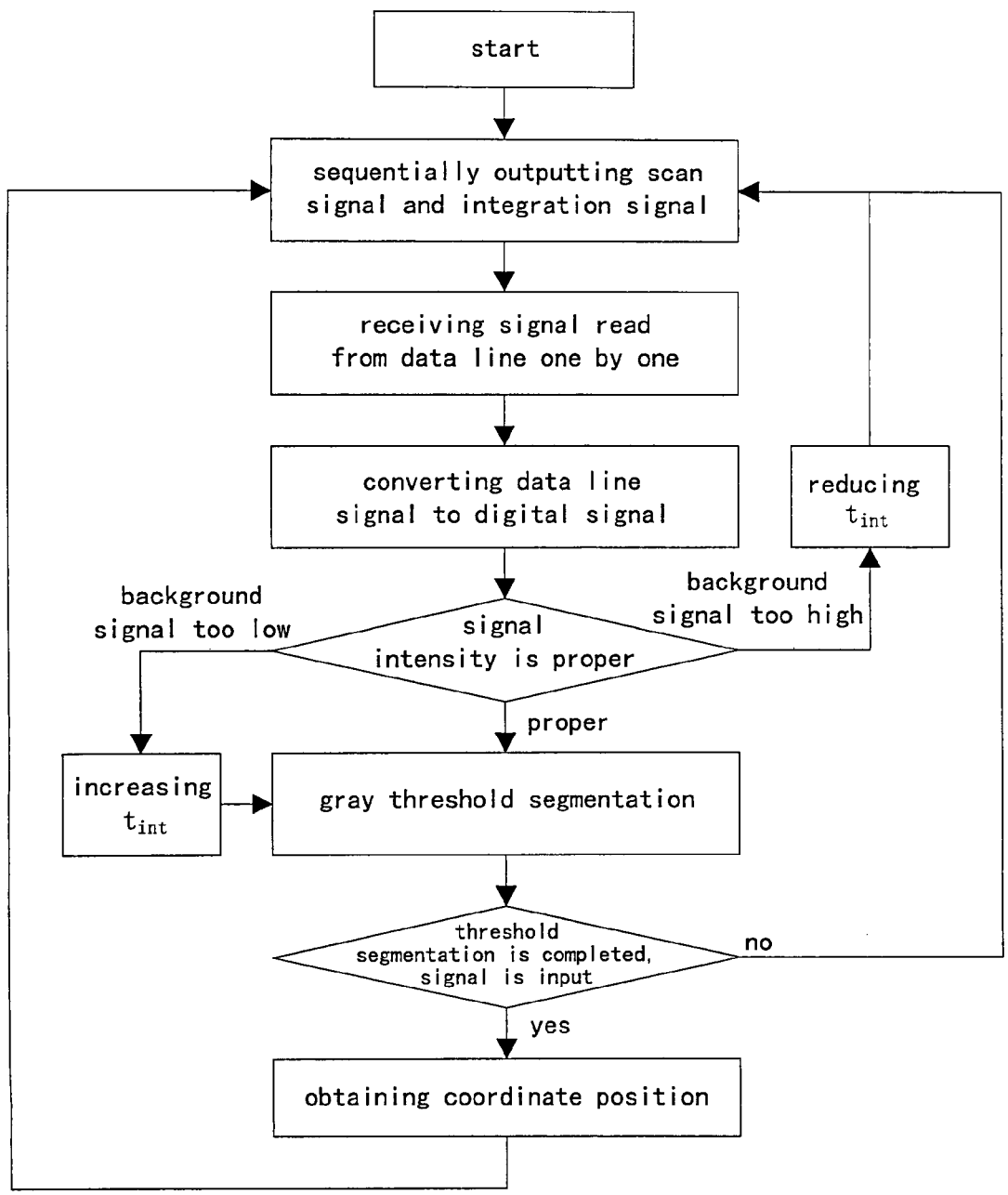
FIG. 6 is an operation flow chart of a photoelectric touch panel according to an exemplary embodiment of the present invention.

FIG. 6 is an operation flow chart of a photoelectric touch panel according to an exemplary embodiment of the present invention. As shown in FIG. 6, the flow chart comprising steps of:

After the touch panel is started, performing the integration, scan and read operations on the electrical signal according to a preset time sequence;

Converting the signal read from the data line to the digital signal;

Determining the signal intensity according to a histogram of the signal and the average value of the signal; in order to correctly identify the input signal from the light pen, the integration time $t_{int}$ may be properly adjusted to control the background signal in a relative low range, please be noted that the background signal cannot be controlled too low, because it may cause the integration time $t_{int}$ too short and cannot identify the input signal from the light pen; in addition, it is necessary to set the intensity of the photo signal input from the light pen stronger than that of the environment light, and the voltage value obtained by integrating the background signal may be controlled within a range of 10%~50% of $V_{dd}$ in practical use;

Performing a threshold segmentation operation on the array digital signal by taking it as the image signal; if the threshold segmentation operation is not successfully completed and the coordinate position of the photo signal input from the light pen is not obtained, then it can determine that there is no photo signal input; if the threshold segmentation operation is successfully completed, then the coordinate position of the photo signal input from the light pen is obtained, and the computer may perform a corresponding operation according to the coordinate position.

Figure 7:
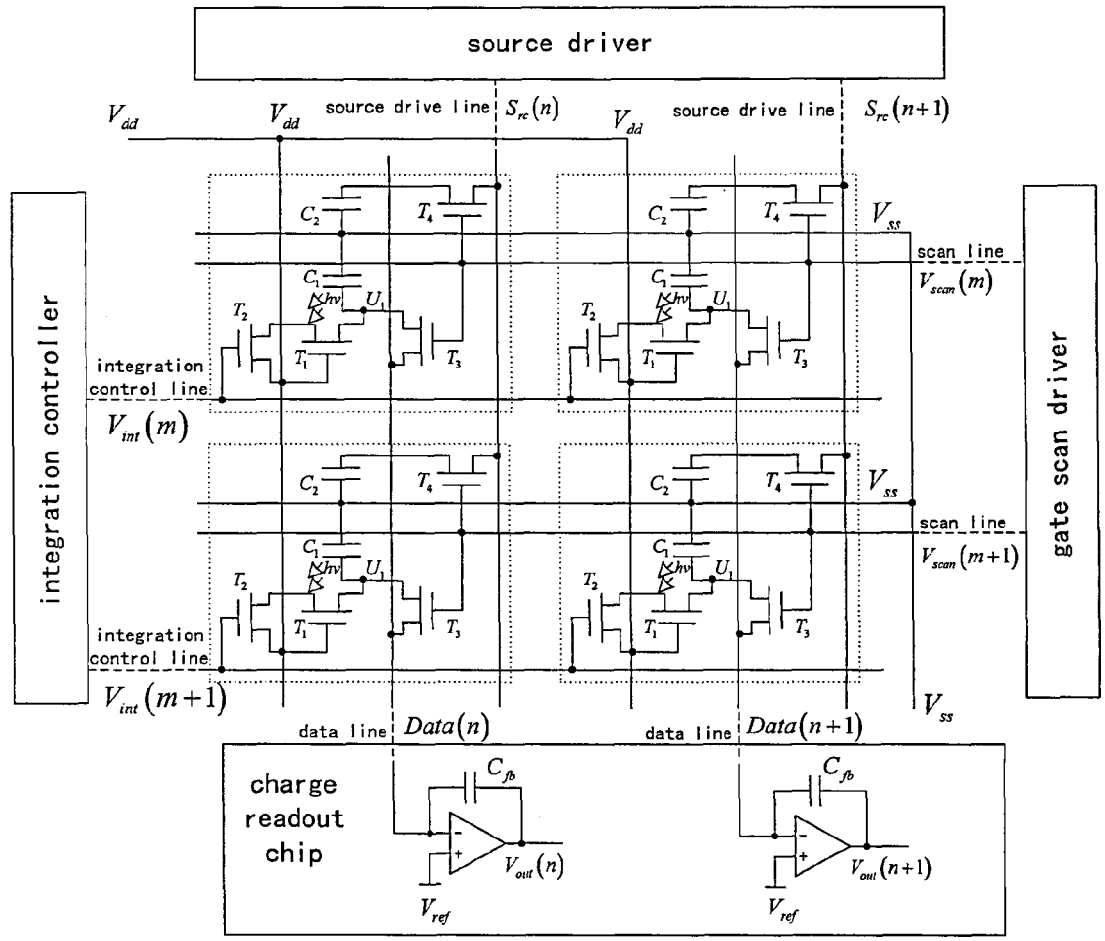
FIG. 7 is an illustrative principle view of a thin film transistor-liquid crystal display with a photoelectric touch function according to an exemplary embodiment of the present invention.

(2) FIG. 7 is an illustrative principle view of a thin film transistor-liquid crystal display with a photoelectric touch function according to an exemplary embodiment of the present invention.

As shown in FIG. 7, the scan voltage $V_{scan}$ is supplied by a gate driver, the voltage $V_{int}$ of the integration control circuit is supplied by the integration controller. The liquid crystal pixel is driven by a voltage supplied from a source driver connected to the source drive line. The signal from the photoelectric touch sensor is read by the discharge readout chip through the data line. The operation process of FIG. 7 is the same as the sequence diagram of FIG. 5 and the flow chart of FIG. 6. Compared with the above embodiments, the embodiment of FIG. 7 is different only in that the touch function is incorporated into the TFT-LCD and a display with the touch function is achieved. When the gate scan line scans the $m^{th}$ row, the source driver loads a pixel voltage for displaying the $m^{th}$ row onto a source drive line of a respective column, thereby the pixel voltage of the $m^{th}$ row can be loaded on the storage capacitor of the pixel through a liquid crystal pixel TFT of the fourth TFT T4 to control the deflection of the liquid crystal and achieve the display function.

For the pixel structure design, the active layers of all TFTs are completely blocked by a metal layer at a side adjacent to a backlight so as to avoid the increasing of the drain current of the TFTs and prevent the property of the TFTs from being affected by the backlight. The active layers of other TFTs except the photoelectric TFT are blocked by the black matrix of the liquid crystal panel at a side adjacent to the liquid crystal panel so as to prevent the property of the TFTs from being affected by the environment light. The active layer of the photoelectric TFT can receive the light input from the light pen through an unblocked window at the side adjacent to the liquid crystal panel.

In the present invention, the drain electrode of the first thin film transistor T1 is connected to one end of the first capacitor C1 and the source electrode of the third thin film transistor T3, the source electrode of the first thin film transistor T1 is connected to the drain electrode of the second thin film transistor T2. Thereby, the present invention overcomes the problem of the charging saturation occurred in the photoelectric TFT of the conventional photoelectric sensor shown in FIG. 1 due to the connection of the source electrode and the drain electrode thereof. As a result, the photoelectric sensor of the present invention has a strong anti-interference ability and is very sensitive to the photo signal input from the light pen. In addition, the photoelectric touch panel incorporated with the photoelectric sensors can accurately identify the photo signal input from the light pen.

In the above embodiments, the integration controller is used as an example of the integration control circuit for providing the integration signal, the gate scan driver is used as an example of the gate scan drive circuit for providing the scan signal; the charge readout chip is used as an example of the charge readout circuit for reading electrical charges; the source driver is used as an example of the direct current voltage circuit for providing the high level of the power source.

It should be appreciated for those skilled in this art that the above embodiments are intended to be illustrated, and not restrictive to the scope of the present invention. Although several exemplary embodiments have been shown and described, it would be appreciated by those skilled in the art that various changes or modifications may be made in these embodiments without departing from the principles and spirit of the disclosure. For example, although it defines the feature that the source electrode of the first thin film transistor T1 is connected to the drain electrode of the second thin film transistor T2 in the above embodiments, it should be appreciated for those skilled in this art that the drain electrode and the source electrode of the thin film transistor is similar to each other in function and can be interchanged according to the channel type of the thin film transistor, and this is an equivalent of the present invention, thereby, the scope of which is defined in the claims and their equivalents.

What is claimed is:

1. A photoelectric sensor, comprising:
    a first thin film transistor (T1) for converting a photo signal into an electrical signal;
    a second thin film transistor (T2) for performing an integration operation on the electrical signal;
    a third thin film transistor (T3) for reading the electrical signal; and
    a first capacitor (C1) for storing an energy of the electrical signal,
    wherein a drain electrode of the first thin film transistor (T1) is directly connected to one end of the first capacitor (C1) and a source electrode of the third thin film transistor (T3); a source electrode of the first thin film transistor (T1) is directly connected to a drain electrode of the second thin film transistor (T2); a gate electrode of the first thin film transistor (T1) is supplied with a bias signal;
    wherein a gate electrode of the second thin film transistor (T2) is supplied with an integration signal; a source electrode of the second thin film transistor (T2) is directly connected to a high level end of a power source; the other end of the first capacitor (C1) is directly connected to a low level end of the power source; and
    wherein a gate electrode of the third thin film transistor (T3) is supplied with a scan signal;
    a drain electrode of the third thin film transistor (T3) is configured to output the read electrical signal.

2. The photoelectric sensor according to claim 1, further comprising:
    a fourth thin film transistor (T4) for loading a voltage to a pixel; and
    a second capacitor (C2) for maintaining the voltage stable,
    wherein a gate electrode of the fourth thin film transistor (T4) is directly connected to the gate electrode of the third thin film transistor (T3); and
    wherein one end of the second capacitor (C2) is directly connected to the one end of the first capacitor (C1) and the low level end of the power source, and the other end of the second capacitor (C2) is directly connected to a drain electrode of the fourth thin film transistor (T4).

3. A photoelectric touch panel, comprising:
    a plurality of photoelectric sensors according to claim 1;
    a substrate for carrying the photoelectric sensor thereon;
    an integration control circuit for providing the integration signal;
    a gate scan drive circuit for providing the scan signal;
    a charge readout circuit for reading electrical charges;
    a common voltage circuit for providing the low level of the power source;
    a direct current voltage circuit for providing the high level of the power source; and
    a bias voltage circuit for proving the bias signal,
    wherein the plurality of photoelectric sensors are arranged on the substrate in rows and columns;
    wherein the gate electrode of the first thin film transistor (T1) of each of the photoelectric sensors is directly connected to the bias voltage circuit;
    wherein the first capacitor (C1) of the photoelectric sensor is directly connected to the common voltage circuit;
    wherein the source electrode of the second thin film transistor (T2) of the photoelectric sensor is directly connected to the direct current voltage circuit, and the gate electrode of the second thin film transistor (T2) of the photoelectric sensor is connected to the integration control circuit; and
    wherein the gate electrode of the third thin film transistor (T3) of the photoelectric sensor is directly connected to the gate scan drive circuit, and the drain electrode of the third thin film transistor (T3) of the photoelectric sensor is directly connected to the charge readout circuit.

4. The photoelectric touch panel according to claim 3, further comprising:
    an analog to digital conversion circuit directly connected to an output end of the charge readout circuit.

5. The photoelectric touch panel according to claim 3, wherein the charge readout circuit comprises a plurality of integral amplifiers;
    wherein the positive electrode of the integral amplifier is directly connected to a reference voltage, the negative electrode of the integral amplifier is used as an input end of the charge readout circuit, and the output end of the integral amplifier is used as the output end of the charge readout circuit and directly connected to the negative electrode of the integral amplifier through a third capacitor.

6. A photoelectric touch panel, comprising:
    a plurality of photoelectric sensors according to claim 2;
    a substrate for carrying the photoelectric sensor thereon;
    an integration control circuit for providing the integration signal;
    a gate scan drive circuit for providing the scan signal;
    a charge readout circuit for reading electrical charges;
    a common voltage circuit for providing the low level of the power source;
    a direct current voltage circuit for providing the high level of the power source; and
    a bias voltage circuit for proving the bias signal,
    wherein the plurality of photoelectric sensors are arranged on the substrate in rows and columns;
    wherein the gate electrode of the first thin film transistor (T1) of the photoelectric sensor is directly connected to the bias voltage circuit;
    wherein the first capacitor (C1) of the photoelectric sensor is directly connected to the common voltage circuit;
    wherein the source electrode of the second thin film transistor (T2) of the photoelectric sensor is directly connected to the direct current voltage circuit, and the gate electrode of the second thin film transistor (T2) of the photoelectric sensor is directly connected to the integration control circuit; and
    wherein the gate electrode of the third thin film transistor (T3) of the photoelectric sensor is directly connected to the gate scan drive circuit, and the drain electrode of the third thin film transistor (T3) of the photoelectric sensor is directly connected to the charge readout circuit.

7. The photoelectric touch panel according to claim 6, further comprising:
    a source electrode drive circuit directly connected to the source electrode of the fourth thin film transistor (T4).

* * * * *